(12) United States Patent
Lelental et al.

(10) Patent No.: US 7,033,713 B2
(45) Date of Patent: *Apr. 25, 2006

(54) ELECTROGRAPHIC PATTERNING OF CONDUCTIVE ELECTRODE LAYERS CONTAINING ELECTRICALLY-CONDUCTIVE POLYMERIC MATERIALS

(75) Inventors: Mark Lelental, Rochester, NY (US); Mitchell S. Burberry, Webster, NY (US); Charles C. Anderson, Penfield, NY (US)

(73) Assignee: Eastman Kodak, Rochester, NY (US)

( * ) Notice: Subject to any disclaimer, the term of this patent is extended or adjusted under 35 U.S.C. 154(b) by 145 days.

This patent is subject to a terminal disclaimer.

(21) Appl. No.: 10/648,418

(22) Filed: Aug. 26, 2003

(65) Prior Publication Data

US 2005/0048391 A1    Mar. 3, 2005

(51) Int. Cl.
*G03G 15/20* (2006.01)

(52) U.S. Cl. .................... 430/33; 430/108.1; 430/112; 430/126

(58) Field of Classification Search ................ 430/112, 430/117, 126, 33, 108.1; 428/219
See application file for complete search history.

(56) References Cited

U.S. PATENT DOCUMENTS

| | | | |
|---|---|---|---|
| 4,070,189 A | 1/1978 | Kelley et al. | |
| 4,731,408 A | 3/1988 | Jasne | |
| 4,987,042 A | 1/1991 | Jonas et al. | |
| 5,093,439 A | 3/1992 | Epstein et al. | |
| 5,300,575 A | 4/1994 | Jonas et al. | |
| 5,312,681 A | 5/1994 | Muys et al. | |
| 5,354,613 A | 10/1994 | Quintens et al. | |
| 5,370,981 A | 12/1994 | Krafft et al. | |
| 5,372,924 A | 12/1994 | Quintens et al. | |
| 5,391,472 A | 2/1995 | Muys et al. | |
| 5,403,467 A | 4/1995 | Jonas et al. | |
| 5,443,944 A | 8/1995 | Krafft et al. | |
| 5,561,030 A | 10/1996 | Holdcroft et al. | |
| 5,575,898 A | 11/1996 | Wolf et al. | |
| 5,665,498 A | 9/1997 | Savage et al. | |
| 5,674,654 A | 10/1997 | Zumbulyadis et al. | |
| 5,716,550 A | 2/1998 | Gardner et al. | |
| 5,976,274 A | 11/1999 | Inoue et al. | |
| 6,045,977 A | 4/2000 | Chandross et al. | |
| 6,524,760 B1 * | 2/2003 | Ikeuchi et al. | ......... 430/41 |

FOREIGN PATENT DOCUMENTS

| | | |
|---|---|---|
| EP | 440 957 A | 3/1996 |
| EP | 615 256 A | 9/1998 |
| EP | 1 079 397 A1 | 2/2001 |
| EP | 686 662 A | 11/2002 |
| EP | 1 054 414 A | 3/2003 |

OTHER PUBLICATIONS

Co-pending U.S. Appl. No. 10/648,419, Lelental et al., Photopatterning of Conductive Electrode Layers Containing Electrically-Conductive Polymer Particles (D-83892).
Co-pending U.S. Appl. No. 10/648,420, Anderson et al., Patterning of Electrically Conductive Layers by Ink Printing Methods (D-83879).
Co-pending U.S. Appl. No. 10/648,421, Burberry et al., Method of Patterning an Electroconductive Layer on a Support (D-84232).

* cited by examiner

*Primary Examiner*—John L Goodrow
(74) *Attorney, Agent, or Firm*—Paul A. Leipold

(57) ABSTRACT

A method for producing an electrode pattern in a conductive polymeric layer comprising the steps of: (a) contacting a charge pattern with an electrographic developer composition comprising a carrier and marking particles having a polarity opposite that of said charge pattern thereby producing a developed image pattern, wherein said marking particles contain a conductivity modifier or a precursor thereof; (b) applying the developed image pattern to a conductive layer containing a conductive polymer on a substrate and (c) transferring said image pattern onto a said conductive layer. An element formed by the method is also disclosed.

32 Claims, No Drawings

ELECTROGRAPHIC PATTERNING OF CONDUCTIVE ELECTRODE LAYERS CONTAINING ELECTRICALLY-CONDUCTIVE POLYMERIC MATERIALS

CROSS REFERENCE TO RELATED APPLICATIONS

This application relates to commonly assigned U.S. Pat. No. 6,893,790 entitled PHOTOPATTERNING OF CONDUCTIVE ELECTRODE LAYERS CONTAINING ELECTRICALLY-CONTAINING POLYMER PARTICLES, Ser. No. 10/648,420 entitled PATTERNING OF ELECTRICALLY CONDUCTIVE LAYERS BY INK PRINTING METHODS, and U.S. Pat. No. 6,872,500 entitled METHOD OF PATTERNING AN ELECTROCONDUCTIVE LAYER ON A SUPPORT, filed simultaneously herewith. The copending applications are incorporated by reference herein for all that they contain.

FIELD OF THE INVENTION

This invention is directed to the manufacturing of patterned transparent electrode arrays. In general this invention relates to patterning of transparent thin film electrode elements, and in particular to electrographic patterning of electrically-conductive transparent thin films comprising a support, and a patternable electrically-conductive layer. More specifically, this invention relates to electrically-conductive layers containing a polymeric binder, electronically-conductive polymer particles that are patternable using electrographic imaging processes employing electrographic toners comprising conductivity-enhancing or conductivity-degrading agent(s). Electrographic image patterns are developed using marking toner particles comprising a conductivity modifying agent or its precursor. The development of the electrode pattern is completed by the application of uniform heat and (or) pressure to the imagewise "toned" thin film electrode element of this invention.

BACKGROUND OF THE INVENTION

Transparent electrically-conductive layers (TCL) of metal oxides such as indium tin oxide (ITO), antimony doped tin oxide, and cadmium stannate (cadmium tin oxide) are commonly used in the manufacture of electrooptical display devices such as liquid crystal display devices (LCDs), electroluminescent display devices, photocells, solid-state image sensors or electrochromic windows.

Devices such as flat panel displays typically contain a substrate provided with an indium tin oxide (ITO) layer as a transparent electrode. The coating of ITO is carried out by vacuum sputtering methods, which involve high substrate temperature conditions up to 250° C., and therefore, glass substrates are generally used. The high cost of the fabrication methods and the low flexibility of such electrodes, due to the brittleness of the inorganic ITO layer as well as the glass substrate, limit the range of potential applications. As a result, there is a growing interest in making all-organic devices, comprising plastic resins as a flexible substrate and organic electroconductive polymer layers as an electrode. Such plastic electronics allow low cost devices with new properties. Flexible plastic substrates can be provided with an electroconductive polymer layer by continuous hopper or roller coating methods (compared to batch process such as sputtering) and the resulting organic electrodes enable the "roll to roll" fabrication of electronic devices which are more flexible, lower cost, and lower weight.

Intrinsically conductive polymers have recently received attention from various industries because of their electronic conductivity. Although many of these polymers are highly colored and are less suited for TCL applications, some of these intrinsically conductive polymers, such as substituted or unsubstituted pyrrole-containing polymers (as mentioned in U.S. Pat. Nos. 5,665,498 and 5,674,654), substituted or unsubstituted thiophene-containing polymers (as mentioned in U.S. Pat. Nos. 5,300,575, 5,312,681, 5,354,613, 5,370,981, 5,372,924, 5,391,472, 5,403,467, 5,443,944, 5,575,898, 4,987,042, and 4,731,408) and substituted or unsubstituted aniline-containing polymers (as mentioned in U.S. Pat. Nos. 5,716,550, 5,093,439, and 4,070,189) are transparent and not prohibitively colored, at least when coated in thin layers at moderate coverage. Because of their electronic conductivity instead of ionic conductivity, these polymers are conducting even at low humidity.

EP-A-440 957 describes a method for preparing polythiophene in an aqueous mixture by oxidative polymerization in the presence of a polyanion as a doping agent. In EP-A-686 662 it has been disclosed that highly conductive layers of polythiophene, coated from an aqueous coating solution, could be made by the addition of a di- or polyhydroxy and/or a carbonic acid, amide or lactam group containing compound in the coating solution of the polythiophene. Coated layers of organic electroconductive polymers can be patterned into electrode arrays using different methods. The known wet-etching microlithography technique is described in WO97/18944 and U.S. Pat. No. 5,976,274 wherein a positive or negative photoresist is applied on top of a coated layer of an organic electroconductive polymer, and after the steps of selectively exposing the photoresist to UV light, developing the photoresist, etching the electroconductive polymer layer and finally stripping the non-developed photoresist, a patterned layer is obtained. In U.S. Pat. No. 5,561,030 a similar method is used to form the pattern except that the pattern is formed in a continuous layer of prepolymer which is not yet conductive and that after washing the mask away the remaining prepolymer is rendered conductive by oxidation. Such methods that involve conventional lithographic techniques are cumbersome as they involve many steps and require the use of hazardous chemicals.

EP-A-615 256 describes a method to produce a pattern of a conductive polymer on a substrate that involves coating and drying a composition containing 3,4-ethylenedioxythiophene monomer, an oxidation agent, and a base; exposing the dried layer to UV radiation through a mask; and then heating. The UV exposed areas of the coating comprise non-conductive polymer and the unexposed areas comprise conductive polymer. The formation of a conductive polymer pattern in accordance with this method does not require the coating and patterning of a separate photoresist layer.

U.S. Pat. No. 6,045,977 describes a process for patterning conductive polyaniline layers containing a photobase generator. UV exposure of such layers produces a base that reduces the conductivity in the exposed areas.

EP-A-1 054 414 describes a method to pattern a conductive polymer layer by printing an electrode pattern onto said conductive polymer layer using a printing solution containing an oxidant selected from the group $ClO^-$, $BrO^-MnO_4^-$, $Cr_2O_7^{-2}$, $S_2O_8^{-2}$, and $H_2O_2$. The areas of the conductive layer expos the oxidant solution are rendered nonconductive.

Research Disclosure, November 1998, page 1473 (disclosure no. 41548) describes various means to form patterns in conducting polymer, including photoablation wherein the selected areas are removed from the substrate by laser irradiation. Such photoablation processes are convenient, dry, one-step methods but the generation of debris may require a wet cleaning step and may contaminate the optics and mechanics of the laser device. Prior art methods involving removal of the electroconductive polymer to form the electrode pattern also induce a difference of the optical density between electroconductive and non-conductive areas of the patterned surface, which should be avoided.

Methods of patterning organic electroconductive polymer layers by image-wise heating by means of a laser have been disclosed in EP 1 079 397 A1. That method induces about a 10 to 1000 fold decrease in resistivity without substantially ablating or destroying the layer.

As indicated herein above, the art discloses a wide variety of electrically conductive thin film compositions. However, there is still a critical need in the art for a patterned conductive thin film structures. In addition to providing superior electrode performance, these thin film conductive layers also must be patternable, must resist the effects of humidity change, and be manufacturable at a reasonable cost.

It is toward the objective of providing such improved electrically conductive, patternable, preferably web coatable, thin films that more effectively meet the diverse commercial needs than those of the prior art, that the present invention is directed.

The thin film electrode layers of this invention are patterned by electrographic development process. The electrographic marking toner particles comprising conductivity enhancing or conductivity degrading agent(s) are employed for electrographic patterning of the electrode layer. The final pattern is "fixed" by means of pressure and (or) heat fixing step, whereupon the conductivity modifier material and other substances incorporated in the marking toner particle interact with, the electrically conductive polymer material and localized alteration i.e. enhancement or degradation of conductivity occurs, whereupon an electrode pattern is developed.

Electrographic imaging and development processes have been extensively described in both the patent and technical literature. Such electrographic imaging and development processes include the processes of electrophotography, electrophoretic migration imaging and modulated electrostatic printing. A typical electrophotographic process employs a photoconductive element comprising a coating of a photoconductive insulating material on a conductive support. The element is given a uniform charge in the dark and then is exposed to an image pattern of activating electromagnetic radiation such as white light or X-rays. The charge on the photoconductive element is dissipated in the illuminated areas to form an electrostatic charge pattern which is then developed by contact with a developer composition comprising a carrier and an electrographic toner marking material. The marking particles deposit on the surface bearing the electrostatic charge pattern, in accordance with either the charge pattern or the discharge patterns as desired.

In a typical electrophoretic migration imaging process, an imaging composition comprising electrostatic charge-bearing photoconductive particles, i.e. electrically photosensitive particles, is positioned between two spaced electrodes, one of which may be transparent. To achieve image formation in this process, the electrically photosensitive particles positioned between the two spaced electrodes are subjected to the influence of an electric field and exposed to a pattern of activating radiation. As a result, the electrically photosensitive particles are caused to migrate electrophoretically to the surface of one or the other of the spaced electrodes upon which an image of the pattern of activating radiation is defined by the electrically photosensitive particles.

Typically, a negative image of the pattern is formed on one electrode, and a positive image of the pattern is formed on the opposite electrode. One method of modulated electrostatic printing referred to in the patent literature comprises generating an ion stream in the direction of a print receiving medium, modulating the cross-sectional density flow of ions in the stream in accordance with a pattern to be reproduced, and introducing a cloud of substantially uncharged marking particles adjacent to print receiving medium whereby the modulated ion stream selectively collides with and induces charges on the marking particles in the cloud. The marking particles are then deposited on the printing receiving medium in accordance with the pattern being reproduced. The direction of the ion stream flow is determined by an electrical field. The ion stream is modulated in accordance with the charge pattern by a grid having computer addressed electronic gates.

SUMMARY OF THE INVENTION

The patterning process of this invention combines the use of thin electrode films formulated using electronically conductive polymeric fillers dispersed in a binder with an electrographic imaging process to produce two dimensional electrode arrays such as are common in the art for memory, display and other electronic applications. The thin film electrode array can be patterned by using a suitable electrographic patterning and development processes to provide a desired degree of conductivity modification.

The conductivity of such patterned electrode films can vary depending upon the film formulation, layer thickness, choice of conductivity enhancing or conductivity degrading agent, degree of conductivity enhancement or degradation and other factors readily apparent to one skilled in the art.

DETAILED DESCRIPTION OF THE INVENTION

We have discovered that under the influence of an electrical field, electrographic marking particles comprising a conductivity enhancing or conductivity degrading agent(s) can be deposited in accordance with an image pattern upon a receiver thin film electrode surface where subsequently said agent(s) may be used to define the electrode pattern after development. The phrase "electrographic marking particles" is used herein broadly to include electrically photosensitive particles used in migration imaging processes and any other material used to develop and define an electrographic image pattern such as, for an example, electrographic toners, liquid droplets, resin or polymer particles. Such marking particles may be a composite particle and may contain a colorant.

The marking particles are typically, although not necessarily, brought into contact with the image pattern in an electrographic developer composition comprising a carrier vehicle and the marking particle. The phrase "electrographic developer composition" includes any composition comprising a carrier and the electrographic marking particles of the present invention and is intended for use in developing electrographic image patterns, however formed, including but not limited to, the methods of electrophotographic, electrophoretic migration imaging and modulated electrostatic printing. In general, the novel electrographic marking particles of the present invention can be used to imagewise deliver a desired concentration of the conductivity modifier regardless of how the image pattern is formed if the image pattern is developed with marking particles.

According to one embodiment of the present invention, electrographic marking particles are provided which comprise a conductivity enhancing agent or a conductivity degrading agent. The conductivity enhancing modifier (M-1) of this invention include organic compounds containing dihydroxy or poly-hydroxy and/or carboxyl groups or amide groups or lactam groups. Suitable organic compounds containing dihydroxy or polyhydroxy and/or carboxyl groups or amide groups correspond to (a) formula (II)

$$(OH)_n-R-(COX)_m \qquad (II)$$

wherein m and n are independently an integer of from 1 to 20, R is an alkylene group having 2 to 20 carbon atoms, an arylene group having 6 to 14 carbon atoms in the arylene chain, a pyran group, or a furan group, and X is —OH or —NYZ, wherein Y and Z are independently hydrogen or an alkyl group; or (b) a sugar, sugar derivative, polyalkylene glycol, or glycerol compound; or (c) selected from the group consisting of N-methylpyrrolidone, pyrrolidone, caprolactam, N-methyl caprolactam, or N-octylpyrrolidone.

Preferred radicals R are derived from the furan structure or the pyran structure. Particularly preferred organic compounds (D-1) are: sugar and sugar derivatives such as sucrose, glucose, fructose, lactose; sugar alcohols such as sorbitol, mannitol; furan derivatives such as 2-furancarboxylic acid, 3-furancarboxylic acid; alcohols such as ethylene glycol, glycerol, di- or triethylene glycol.

The conductivity degrading modifier of this invention (M-2) include oxidants selected from the group: $ClO^-$, $BrO^-$, $MnO_4^-$, $Cr_2O_7^{-2}$, $S_2O_8^{-2}$, and $H_2O_2$. The areas of the conductive layer exposed to the oxidant dopant are rendered nonconductive. According to another embodiment of the present invention, electrographic developer compositions are provided comprising a carrier and the electrographic marking particle of the present invention.

According to yet another embodiment of the present invention, a method is provided for developing electrographic image pattern which resides upon an insulated receiver comprising the steps of: (a) contacting a charge pattern with an electrographic developer composition comprising a carrier and charged electrographic marking particles, according to the present invention thereby forming said developed image pattern; and (b) contacting said developed image pattern with a set of heated rollers thereby facilitating an imagewise interaction between thin film electrode layer and the conductivity modifying agent.

According to yet another embodiment of the present invention a method is provided for patterning a thin film electrode layer comprising the steps of: (a) contacting a charge pattern with a developer composition comprising a carrier and neutral electrographic marking particle of the present invention thereby charging said particles; (b) transferring said image pattern into patternable electrically-conductive thin film layer of this invention; and (c) contacting said imaged element with a set of heated pressure rollers thereby facilitating an imagewise interaction between thin film electrode layer and the conductivity modifying agent.

According to yet another embodiment of the present invention, a method is provided for forming an electrode pattern by an electrophoretic migration imaging process comprising the steps of: (a) subjecting an electrically photosensitive material positioned between at least two electrodes to an applied electric field, wherein said electrically photosensitive material contains a conductivity modifier; (b) exposing said material to an image pattern of radiation to which the material is photosensitive, thereby obtaining a developed image pattern on at least one of said electrodes; and (c) contacting said developed image pattern with a set of pressure heated rollers thereby facilitating an imagewise interaction between thin film electrode layer and the conductivity modifying agent.

The invention will be described and illustrated herein in connection with the patterning of thin film electrode layers by the techniques of electrophotography, electrophoretic migration imaging and modulated electrostatic printing. It will be readily understood by those skilled in the art that the invention will be in general, applicable to any electrographic technique which uses marking particles for defining image patterns.

The present invention will also be described herein in connection with electrographic developer compositions comprising liquid carriers. It is clear, as explained herein after that the invention will be equally useful in developer compositions comprising dry carrier material.

In general the conductivity modifying agents which are useful in the present invention may be chosen from any of the materials known to be useful as conductivity modifiers for the thin film electrode layers comprising electronically conductive polymer. In general, the electrographic marking particles of the present invention include carbon and resins or polymers. When resins or polymers are used with a liquid carrier, they are preferably insoluble in the liquid carrier or only slightly soluble therein. If the resinous binder has suitable optical density or if no optical density is desired in the image to be developed, the resulting marking particles may be used without any colorant material such as a dye or pigment. Suitable resinous materials used to form marking particles include resins, including natural resins, hydrogenated resins and esters of hydrogenated resins; alkyl methacrylate copolymers having from 2 to 5 carbon atoms in each alkyl moiety, such as isobutyl methacrylate and normal butyl methacrylate copolymers, etc; phenolic resins including modified phenolic resins such as phenol form-aldehyde resins; ester gum resins; vegetable oil polya-mides; alkyd resins, including modified alkyds such assoya oil-modified and linseed oil modified alkyds, phthalic, maleic and styrenated alkyds, etc; and the like.

Other useful resinous materials include polymerized blends of certain soluble monomers, polar monomers, and, if desired, insoluble monomers as described in Belgian Pat. No. 784,367 dated Jun. 30, 1972. Other patents describing suitable resins, methods for forming marking materials and liquid development compositions include for an example: U.S. Pat. No. 3,779,924 issued to Chechak dated Dec. 18, 1973; U.S. Pat. No. 3,788,995 issued to Stahly e al., dated Jan. 29, 1974; and U.S. Pat. No. 3,770,638 issued to Chechak dated Nov. 6, 1973. Suitable resinous materials are also disclosed in Research Disclosure Vol. 109, Index No. 10938, May 1973.

The electrographic liquid developers of the present invention preferably contain a suitable amount of the electrographic toner or marking particles of the present invention admixed in a liquid carrier vehicle. Conventionally, the liquid carrier vehicle used in liquid developers has a low dielectric constant less than about 3.0 and a resistivity of at least about $10^8$ ohm-centimeters, preferably at least $10^{10}$ ohm-centimeters. Among the various useful liquid carrier vehicles are alkyl-aryl materials such as the xylenes, benzene, alkylated benzenes and other alkylated aromatic hydrocarbons such as are described in U.S. Pat. No. 2,899,335 noted above. Other useful liquid carrier vehicles are various hydrocarbons and halogenated hydrocarbons such as cyclohexane, cyclopentane, n-pentane, n-hexane, carbon tetra-chloride, fluorinated lower alkanes such as trichloomonofluorane, trichlorotrifluoroethane, etc., typically having a boiling range of from about 2° C., to about 55° C. Other useful hydrocarbon liquid carrier vehicles are the paraffinic hydrocarbons, for example, the isoparaffinichydrocarbon liquids having a boiling point in the range of 145° C. to 185° C. (sold under the trademark Isopar by Humble Oil and Refining Co.). Various other petroleum distillates and mixtures thereof may also be used as liquid carrier vehicles.

Additional carrier liquids which may be useful in certain situations include polysiloxane oils such as dimethyl polysiloxane, odorless mineral spirits, etc. Liquid developers comprising the electrographic marking particles according to the invention may be conveniently prepared by first forming a developer concentrate. One such concentrate is described in Robinson, U.S. Pat. No. 3,551,337 issued Dec. 29, 1970. To form a concentrate, a suitable polymer or polymers along with the selected conductivity modifier according to the present invention may be dissolved in a mild solvent and placed in a ball mill. If pigments or colorants are to be added they also may be placed in the mix and the combination is milled for a suitable time. Alternatively, the polymer or resins to be used may be dissolved alone initially, and placed on heated compounding rolls which are useful to stir or otherwise blend a resin-containing mixture to promote the complete intermixing of the various ingredients.

After thorough blending on such compounding rolls, the mixture is cooled and solidified. The resultant solid mass may then be broken into small pieces and finely ground or milled to form a free flowing powder of finely-divided oleophilic resinous marking particles. Often, milling is done in the presence of a final carrier liquid or a liquid mutually soluble in it in order that resin, conductivity modifier, colorant (if utilized) and carrier may become thoroughly mixed. After milling is completed the developer concentrate thus formed may be kept for substantial periods. A working developer may be quickly prepared from the concentrate by diluting it to working strength by thoroughly blending it with a suitable electrically insulating carrier liquid. The amount of conductivity modifier or its precursor in the marking particles of the present invention is about 0.01 weight percent to about 30 weight percent. The amount of conductivity modifier or its precursor in the final electrographic liquid developer composition is about $10^{-6}$ g/liter to about 100 g/liter. The resultant developer is in the form of a carrier liquid having admixed therein the finely divided marking particles.

If charge control agents, etc. are utilized, such agents may also be blended with the liquid carrier and finely divided marking particles during the milling operation described above. Advantageously, the size of the finely-divided marking particles used in the liquid developer may vary within the range of about 0.05 micron to about 20 microns, preferably within the range of from about 0.1 micron to about 2.0 microns. Electrographic liquid developer compositions may be formed without the use of resinous materials. Such compositions are useful in electrographic imaging and development methods which employ liquid mist developer compositions.

Compositions of this type may be formed simply by dissolving a suitable amount of conductivity modifier or its precursor in liquid medium of the type described above for use in electrographic developer compositions containing resinous marking particles. When in use this composition is atomized to form a liquid mist consisting of liquid droplets each containing a conductivity modifier or its precursor according to the invention. The concentration of conductivity modifier or its precursor added to the liquid medium ranges from $10^{-6}$ g/liter to about 100 g/liter.

As stated herein before, the electrographic developing compositions of the present invention may also include dry carrier materials instead of liquid carrier materials. Such developers may comprise electrostatically responsive toner particles and a particulate carrier, for example, nonmagnetic particles such as glass beads, crystals of in-organic salts such as sodium or potassium chloride, hard resin particles, metal particles, etc.

In addition, magnetic carrier particles may be used such as steel, iron, cobalt, nickel and alloys and mixtures thereof. The size of carrier particles used in electrostatic dry developers may vary from about 1.0 to about 30.0 microns although particles outside this range may also be used for particular development conditions or developer com-positions. Various types of suitable carrier particles are described in greater detail in Walkup, U.S. Pat. No. 2,618,551, issued Nov. 18, 1952; Wise, U.S. Pat. No. 2,618,552, issued Nov. 18, 1952; Greig, U.S. Pat. No. 2,874,063, is-sued Feb. 17, 1959; and Maho, Canadian Pat. No. 838,061, issued Mar. 31, 1970. Methods of making and using dry developer compositions are described for an example in Research Disclosure Volume 109, Index No. 10938 published May 1973, which is expressly incorporated here-in by reference.

In Section VIII, page 64 of Research Disclosure Volume 109, Index No. 10938 published May 1973, the following is taught about dry developers:

Dry Developers

Typical electrostatic dry developers comprise electrostatically responsive toner particles and a particulate carrier, for example, non-magnetic particles such as glass beads, crystals of inorganic salts such as sodium or potassium chloride, hard resin particles, metal particles, etc. In addition, magnetic carrier particles may be used such as steel, iron, cobalt, nickel and alloys and mixtures thereof.

The size of carrier particles used in electrostatic dry developers may vary from about 10.0 to about 1500.0 microns although particles outside this range may also be used for particular development condition or developer compositions.

Carrier particles suitable for use in various magnetic brush development systems include magnetic carrier particles. Such particles may have a variable composition; for example, the particles may have a magnetic core overcoated with a non-magnetic material such as a resin; or the particles may have a non-magnetic core such as a metallic material, a plastic material, etc. overcoated with a magnetic shell; or the particles may be composed of hollow magnetic balls. Alternatively, a number of small magnetic particles may be joined together by a binder material to form magnetic carrier particles.

In the manufacture of carrier particles suitable for use in conventional dry electrostatic developers, a variety of pre-treatment or post-treatment operations may be performed to improve various properties of the carrier particles. A variety of such techniques and modifications are available for altering the electrical properties of the carrier particles The toner particles (or marking particles) useful in dry electrographic developer compositions are generally comprised of a resin binder and a colorant, such as a dye or pigment. Suitable toners can be selected from materials to give desired physical properties to the developed image and the proper triboelectric relationship to match the carrier particles used.

Generally, any of the toner particles known in the art are suitable for mixing in dry developer compositions. In certain instances, the toner may be comprised solely of colorant material, for example, carbon particles, without any resinous binder. In other cases, where a visible image is not desired or needed, the toner may be composed solely of a material, such as a resinous material, having the desired physical and triboelectric properties without any colorant.

When a selected toner powder is utilized with ferromagnetic carrier particles in a magnetic brush development arrangement, the toner clings to the carrier by triboelectric attraction. The carrier particles acquire a charge of one polarity and the toner acquires a charge of the opposite polarity. Thus, if the carrier is mixed with a resin toner which is higher in the triboelectric series, the toner normally acquires a positive charge and the carrier a negative charge.

Useful toner granules or particles can be prepared by various methods. Two convenient techniques for preparing these toners are spray-drying or melt blending followed by grinding.

Toner formulations by spray-drying involves dissolving or dispersing a resin, colorant and any additives in a volatile liquid such as dichloromethane or water. This solution or dispersion is then sprayed through an atomizing nozzle using a substantially non-reactive gas such as nitrogen as the atomizing agent. During atomization, the volatile liquid evaporates from the airborne droplets, producing finely divided particles of the resin. The ultimate particle size is determined by varying the size of the atomizing nozzle and the pressure of the atomizing agent.

Suitable toners can be prepared by melt-blending. This technique involves melting a powdered form of polymer or resin and mixing it with suitable colorants and additives. The resin can easily be melted or heated on compounding rolls which are also useful to mix or otherwise blend the resin and addenda so as to promote the complete intermixing of these various ingredients. After thorough blending, the mixture is cooled and solidified. The resultant solid mass is then broken into small pieces and finely ground to form a free-flowing powder of toner granules.

Other examples of developer compositions having dry carriers include aerosol or powder-cloud developers where the carrier comprises a gaseous medium such as air; cascade developers where the carrier typically is a particulate ferromagnetic material; fur brush developers where the carrier typically comprises a rotating brush; etc. Magnetic brush developers and techniques are de-scribed in the following U.S. patents: C. J. Young, U.S. Pat. No. 2,786,439, issued Mar. 26, 1957; E. C. Giaimo, Jr., U.S. Pat. No. 2,786,440, issued Mar. 26, 1957; C. J. Young, U.S. Pat. No. 2,786,441, issued Mar. 26, 1957; H. G. Greig, U.S. Pat. No. 2,811,465, issued Oct. 29, 1957; H. G. Greig, U.S. Pat. No. 2,874,063, issued Feb. 17, 1959; E. C. Giaimo, Jr., U.S. Pat. No. 2,894,163, issued May 16, 1961; W. H. Bliss, U.S. Pat. No. 3,040,704, issued Jun. 26, 1962; H. G. Greig, U.S. Pat. No. 3,117,884, issued Jan. 14, 1964; E. C. Giaimo, Jr. U.S. Pat. No. Re. 25,779, issued May 18, 1965. Other dry developers such as cascade developers have been described in a number of U.S. and foreign patents, such as U.S. Patents: Carlson, U.S. Pat. No. 2,297,691, issued Oct. 6, 1942; Carlson, U.S. Pat. No. 2,551,582, issued May 8, 1951; L. E. Walkup, U.S. Pat. No. 2,618,551.

A typical electrophoretic migration imaging process has been described herein before as background for the present invention. A description of such processes including methods of making dispersions or developers useful therein, may be found in U.S. Pat. No. 2,758,939 by Sugarman issued Aug. 14, 1956; U.S. Pat. Nos. 2,940,847, 3,100,426, 3,140, 175 and 3,143,508, all by Kaprelian; U.S. Pat. Nos. 3,384, 565, 3,384,488 and 3,615,558, all by Tula-gin et al.; U.S. Pat. No. 3,384,566 by Clark; and U.S. Pat. No. 3,383,993 by Yeh.

Another type of electrophoretic migration imaging process which advantageously pro-vides for image reversal is described in Groner, U.S. Pat. No. 3,976,485. Regardless of the particular electrophoretic migration imaging process employed, an essential component of any such process is the electrically photosensitive particles. Electrically photosensitive material containing conductivity modifier or its precursor according to the present invention is useful in any electrophoretic migration imaging process. In general, such electrically photosensitive particles have an average particle size within the range of from about 0.01 micron to about 20 microns, preferably from about 0.01 to about 5 microns. Typically, these particles are composed of one or more colorant materials well known in the art.

Such electrically photosensitive particles may also contain various non photosensitive materials such as electrically insulating polymers, charge control agents, various organic and inorganic fillers, as well as various additional dyes or pigment materials to change or enhance various colorant and physical properties of the electrically photosensitive particle. In addition, such electrically photosensitive particles may contain other photosensitive materials such as various sensitizing dyes and/or chemical sensitizes to alter or enhance their response characteristics to activating radiation.

When the electrically photosensitive particles containing a conductivity modifier or its precursor according to the present invention are dispersed in an electrically insulating carrier material, such carrier material may assume a variety of physical forms and may be selected from a variety of different materials. For example, the carrier material may be a matrix of an electrically insulating, normally solid polymeric material capable of being softened or liquified upon application of heat, solvent, and/or pressure so that the electrically photosensitive particulate material dispersed therein can migrate through the matrix.

In another, more typical embodiment of the invention, the carrier material can comprise an electrically insulating liquid such as decane, paraffin, Sohio Odorless Solvent 3440 (a kerosene fraction marketed by the Standard Oil Company, Ohio), various isoparaffinic hydrocarbon liquids such as those sold under the trademark Isopar by Exxon Corporation and having a boiling point in the range of 145° C. to 186° C., various halogenated hydrocarbons such as carbon tetrachloride, trichloromonofluoromethane, and the like, various alkylated aromatic hydrocarbon liquids such as the alkylated benzenes, for example, xylenes, and other alkylated aromatic hydrocarbons such as are described in U.S. Pat. No. 2,899,335. An example of one such useful alkylated aromatic hydrocarbon liquid which is commercially available is Solvesso 100 made by Exxon Corp. Solvesso 100 has a boiling point in the range of about 157° C. to about 177° C. and is composed of 9 percent xylene, 16 percent of other monoalkyl benzenes, 34 percent dialkyl benzenes, 37 percent trialkyl benzenes, and 4 percent aliphatics. Typically, whether solid or liquid at normal room temperatures, i.e., about 22° C., the electrically insulating carrier material used in the present invention is a material having a resistivity greater than about $10^9$ ohm-cms, preferably greater than about $10^{12}$ ohm-cm.

When the electrically photosensitive particles containing conductivity modifier or its precursor according to the present invention are incorporated in a carrier material, such as one of the above described electrically insulating liquids, various other addenda may also be incorporated in the resultant imaging suspension as indicated herein above.

Electrically photosensitive particles containing a conductivity modifier or its precursor according to the present invention and dispersions or electrographic development compositions containing such particles may be formed according to any of the methods described in the aforementioned patents relating to electrography or migration imaging by simply combining a solution of the conductivity modifier or its precursor with a ball milled dispersion concentrate containing the electrically photosensitive material. For an example a concentrate containing pigment and binder polymer in Solvesso 100 (Exxon Corp.) may be combined with type440, ⅛ inch diameter stainless steel balls. The entire mixture is transferred to a closed container and ballmilled until the desired particle size is obtained. An aliquot of the concentrate, about 5 ml, may then be diluted with a material such as Piccotex 100 (Penn. Ind. Chem. Corp.) in Isopar G. The diluted aliquot is then mixed thoroughly. At this time, the conductivity modifier or its precursor may be added.

Apparatus useful in carrying out electrophoretic migration imaging processes are well known. Typical apparatus is described in the aforementioned patents. In general, any mechanism of conductivity modification will be useful in the present invention. With regard to the present invention it is sufficient to state that marking particles of the present invention are contacted with a thin film electrode layer of this invention comprising (a) electronically conductive polymeric particles, for example, polythiophene or the like and (b) a polymeric film-forming binder. The conductivity modifier causes the enhancement or degradation of electrical conductivity corresponding to the developed charge pattern. As previously stated herein, the conductivity modifiers may provide enhancement or degradation of the thin film electrode layers of this invention.

In accordance with this invention, a patternable thin film electrode element for use in a two dimensional electrode array manufacturing process is comprised of a support, a patternable electrode thin film structure, comprising particles of electronically-conductive polymer, dispersed in a film-forming hydrophilic or hydrophobic binder. The patternable elements of this invention can contain one or more patternable layers and such layers can be coated on any of a very wide variety of supports. Use of an electronically-conductive polymer dispersed in a suitable film-forming binder enables the preparation of a patternable, thin, highly conductive, transparent layer which is strongly adherent to a support as well as to overlying layers. The electrical conductivity provided by the conductive layer of this invention is independent of relative humidity and persists even after exposure to aqueous solutions. The present invention provides a formulation of an electronically conductive polymer (A), dispersed in a polymeric binder (B) and a conductivity modifier incorporated into the electrographic toner marking composition (C).

The electronically conductive polymer-binder formulations can be applied as thin layers to the substrate and by drying can be converted into patternable thin film electrode elements.

Preferred electrically conductive polymers (A) include polypyrrole/poly (styrene sulfonic acid), 3,4-dialkoxy substituted polypyrrole styrene sulfonate, and 3,4-dialkoxy substituted polythiophene styrene sulfonate. Especially preferred electrically conductive polymers are polytiophenes of formula (I)

Polythiophene Formula (I)

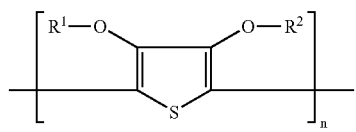

wherein each of $R^1$ and $R^2$ independently represents hydrogen or a $C_1$–$C_4$ alkyl group or together represent an optionally substituted $C_1$–$C_4$ alkylene group or a cycloalkylene group, preferably an ethylene group, an optionally alkyl-substituted methylene group, an optionally $C_1$–$C_{12}$ alkyl- or phenyl-substituted 1,2-ethylene group, a 1,3-propylene group or a 1,2-cyclohexylene group and n is 5–1000

The conductivity enhancing modifiers (M-1) of this invention include organic compounds containing dihydroxy or poly-hydroxy and/or carboxyl groups or amide groups or lactam groups.

Suitable organic compounds containing dihydroxy or polyhydroxy and/or carboxyl groups or amide groups correspond to (a) formula (II)

(II)

wherein m and n are independently an integer of from 1 to 20, R is an alkylene group having 2 to 20 carbon atoms, an arylene group having 6 to 14 carbon atoms in the arylene chain, a pyran group, or a furan group, and X is —OH or —NYZ, wherein Y and Z are independently hydrogen or an alkyl group; or (b) a sugar, sugar derivative, polyalkylene glycol, or glycerol compound; or (c) selected from the group consisting of N-methylpyrrolidone, pyrrolidone, caprolactam, N-methyl caprolactam, or N-octylpyrrolidone.

Examples of suitable organic compounds containing lactam groups are N-methylpyrrolidone, pyrrolidone, caprolactam, N-methylcaprolactam, N-octylpyrrolidone.

Preferred radicals R are derived from the furan structure or the pyran structure.

Particularly preferred organic compounds (B-1) are:

sugar and sugar derivatives such as sucrose, glucose, fructose, lactose; sugar alcohols such as sorbitol, mannitol; furan derivatives such as 2-furancarboxylic acid, 3-furancarboxylic acid; alcohols such as ethylene glycol, glycerol, di- or triethylene glycol.

The modifiers causing degradation of electrical include oxidants selected from the group $ClO^-$, $BrO^-$, $MnO_4^-$, $Cr_2O_7^{-2}$, $S_2O_8^{-2}$, and $H_2O_2$. Frequently the areas of the conductive layer exposed to the oxidant solution are rendered nonconductive.

The method for preparing the noted patternable formulations in accordance with this invention comprises preparing a stable colloidal dispersion of one or more electrically conductive polymeric materials. Such colloidal dispersions are combined with at least one or more polymeric film-forming binders, thickeners, and other additives, and incorporated in patternable thin film electrode element The electrically conductive polymer particles can be coated out of aqueous or nonaqueous coating compositions. The polymers can be chosen from any or a combination of electrically conductive polymers, such as substituted or unsubstituted pyrrole-containing polymers (as mentioned for example, in U.S. Pat. Nos. 5,665,498 and 5,674,654), substituted or unsubstituted thiophene-containing polymers (as mentioned for example, in U.S. Pat. Nos. 5,300,575, 5,312,681, 5,354,613, 5,370,981, 5,372,924, 5,391,472, 5,403,467, 5,443,944, 5,575,898, 4,987,042, and 4,731,408), and substituted or unsubstituted aniline-containing polymers (as mentioned for example, in U.S. Pat. Nos. 5,716,550, 5,093,439, and 4,070,189).

The electrically conductive polymers may be soluble or dispersible in organic solvents or water or mixtures thereof. For environmental reasons, aqueous systems are preferred. Polyanions used in these electrically conductive polymers include the anions of polymeric carboxylic acids such as polyacrylic acids, poly(methacrylic acid), and poly(maleic acid), and polymeric sulfonic acids such as polystyrenesulfonic acids and polyvinylsulfonic acids, the polymeric sulfonic acids being preferred for use in this invention. These polycarboxylic and polysulfonic acids may also be copolymers formed from vinylcarboxylic and vinylsulfonic acid monomers copolymerized with other polymerizable monomers such as the esters of acrylic acid and styrene. The molecular weight of the polyacids providing the polyanions preferably is 1,000 to 2,000,000 and more preferably 2,000 to 500,000. The polyacids or their alkali salts are commonly available, for example as polystyrenesulfonic acids and polyacrylic acids, or they may be produced using known methods. Instead of the free acids required for the formation of the electrically conducting polymers and polyanions, mixtures of alkali salts of polyacids and appropriate amounts of monoacids may also be used.

Preferred electrically conductive polymers include polypyrrole/poly (styrene sulfonic acid), 3,4-dialkoxy substituted polypyrrole styrene sulfonate, and 3,4-dialkoxy substituted polythiophene styrene sulfonate.

In forming an electrode pattern conductivity modifiers which enhance or degrade the conductivity of electrically conductive polymers of these inventions are incorporated into electrographic toner marking particles While electrically conductive polymer particles can be used without a binder in the various photopatternable thin film electrode formulations, preferably, they are dispersed in one or more polymeric, film-forming, binders. In such embodiments, the volume fraction of electrically conductive polymer is preferably in the range of from about 5 to 95% of the weight of the polymer particle/binder dispersion. Preferably, the weight % of polymeric particles is from about 10 to about 90%. The use of significantly less than about 5 weight % polymer particles will not provide a useful level of surface electrical conductivity. The optimum volume ratio of polymer particles to film-forming polymer binder varies depending on the electrical properties of the polymer, binder type, conductivity modifier type, and conductivity requirements of the particular thin film electrode material. The choice of the particular conductivity modifier to be used with the electrically conductive polymer in the patternable thin film electrode element can be advantageous to the benefits provided by the present invention. The combination of conductivity modifier and electrically conductive polymer can be optimized so as to provide a maximum or minimum level of conductivity.

Polymeric film-forming binders useful in electrically conductive patternable thin film electrode layers according to this invention include, but are not limited to, water-soluble or water-dispersible hydrophilic polymers such as gelatin, gelatin derivatives, maleic acid anhydride copolymers, cellulose derivatives (such as carboxymethyl cellulose, hydroxyethyl cellulose, cellulose acetate butyrate, diacetyl cellulose, and triacetyl cellulose), synthetic hydrophilic polymers (such as polyvinyl alcohol, poly-N-vinylpyrrolidone, acrylic acid copolymers, polyacrylamide, their derivatives and partially hydrolyzed products, vinyl polymers and copolymers such as polyvinyl acetate and polyacrylate acid ester), derivatives of the above noted polymers, and other hydrophilic synthetic resins that would be readily apparent to one skilled in the imaging arts. Other suitable binders include aqueous emulsions of addition-type polymers and interpolymers prepared from ethylenically unsaturated polymerizable monomers such as acrylates including acrylic acid, methacrylates including methacrylic acid, acrylamides and methacrylamides, itaconic acid and its half-esters and diesters, styrenes including substituted styrenes, acrylonitrile and methacrylonitrile, vinyl acetates, vinyl ethers, vinyl and vinylidene halides, and olefins and aqueous dispersions of polyurethanes or polyesterionomers. Gelatin and gelatin derivatives are the preferred binders in the practice of this invention.

Solvents useful for preparing dispersions and coatings of photopatternable thin film layers by the method of this invention include, but are not limited to water, alcohols (such as methanol, ethanol, propanol, and isopropanol), ketones (such as acetone, methyl ethyl ketone, and methyl isobutyl ketone), esters such as methyl acetate and ethyl acetate, glycol ethers such as methyl cellusolve, ethyl cellusolve), and mixtures of any of these solvents. Preferred solvents include water, alcohols, and acetone.

In addition to binders and solvents, other components that are well known in the art may also be included in the patternable thin films used in this invention. Such addenda include but are not limited to matting agents, surfactants or coating aids, polymer lattices to improve dimensional stability, thickeners or viscosity modifiers, hardeners or crosslinking agents, soluble antistatic agents, soluble and/or solid particle dyes, antifoggants, lubricating agents, and various other conventional additives readily apparent to one skilled in the art.

Colloidal dispersions of electronically-conductive polymer particles and polymeric binders, and additives can be applied to a variety of flexible or rigid supports. The flexible support are preferable embodiments of this invention. Typical flexible film supports are preferred and include but are not limited to, cellulose nitrate, cellulose acetate, cellulose acetate butyrate, cellulose acetate propionate, poly(vinyl acetal), poly(carbonate), poly(styrene), poly(ethylene terephthalate), poly(ethylene naphthalate), poly(ethylene terephthalate), and poly(ethylene naphthalate) having included therein a portion of isophthalic acid, 1,4-cyclohexane dicarboxylic acid or 4,4-biphenyl dicarboxylic acid used in the preparation of the film support; polyesters wherein other glycols are employed such as, for example, cyclohexanedimethanol, 1,4-butanediol, diethylene glycol, polyethylene glycol, ionomers as described in U.S. Pat. No. 5,138,024, incorporated herein by reference (such as polyester ionomers prepared using a portion of the diacid in the form of 5-sodiosulfo-1,3-isophthalic acid or like ion containing monomers), polycarbonates, and blends or laminates of the above noted polymers. Preferred photographic film supports are cellulose acetate, poly(ethylene terephthalate), and poly (ethylene naphthalate), and most preferably poly(ethylene naphthalate) that is prepared from 2,6-naphthalene dicarboxylic acids or derivatives thereof.

Suitable supports can be either transparent or opaque depending upon the application. Transparent film supports can be either colorless or colored by the addition of a dye or pigment. Film supports can be surface-treated by various processes including corona discharge, glow discharge, UV exposure, flame treatment, e-beam treatment, or treatment with adhesion-promoting agents including dichloro- and trichloroacetic acid, phenol derivatives such as resorcinol and p-chloro-m-cresol, solvent washing or overcoated with adhesion promoting primer or tie layers containing polymers such as vinylidene chloride-containing copolymers, butadiene-based copolymers, glycidyl acrylate or methacrylate-containing copolymers, maleic anhydride-containing copolymers, condensation polymers such as polyesters, polyamides, polyurethanes, polycarbonates, and mixtures and blends thereof. Other suitable opaque or reflective supports are paper, polymer-coated papers, including polyethylene-, polypropylene-, and ethylene-butylene copolymer-coated or laminated paper, synthetic papers, and pigment-containing polyesters. Of these support materials, films of cellulose triacetate, poly(ethylene terephthalate), and poly(ethylene naphthalate) prepared from 2,6-naphthalene dicarboxylic acids or derivatives thereof are preferred.

The thickness of the support is not particularly critical. Support thickness of 0.50 to 10 mils (50 µm to 254 µm) are generally suitable for the materials of the present invention.

Electronically-conductive polymer-film-forming binder formulations can be prepared in the presence of appropriate levels of optional dispersing aids, colloidal stabilizing agents or polymeric co-binders by any of various mechanical stirring, mixing, homogenization or blending processes. Stable colloidal dispersions of suitable electronically conductive polymer particles can be obtained commercially, for example, a stabilized dispersion of thiophene-containing polymer supplied by Bayer Corporation as Baytron P.

Formulations containing dispersions containing electronically-conductive polymer particles, binder(s), and additives can be applied to the aforementioned supports by any of a variety of well-known coating methods. Hand coating techniques include using a coating rod or knife or a doctor blade. Machine coating methods include air doctor coating, reverse roll coating, gravure coating, curtain coating, bead coating, slide hopper coating, extrusion coating, spin coating and the like, and other coating methods well known in the art.

The patternable thin film electrode formulations of this invention can be applied to the support at any suitable coverage depending on the specific requirements of a particular type of imaging element. For example, dry coating weights of the preferred electrically conductive polymer particles dispersion in a patternable thin film electrode formulations are preferably in the range of from about 0.002 to about 0.5 g/m². More preferred dry coverage is in the range of from about 0.003 to about 0.1 g/m².

The thin film electrode layers formed by process of this invention typically exhibit a surface resistivity (at 20% relative humidity and 20° C.) of less than $1 \times 10^{10}$ ohms/square, preferably less than $1 \times 10^7$ ohms/square, and more preferably less than $1 \times 10^4$ ohms/square.

The patternable thin film electrode elements described herein can be incorporated into multilayer structures in any of various configurations depending upon the requirements of the specific application. The patternable thin film electrode elements can be applied on either or both sides of the support.

What is claimed is:

1. A method for producing an electrode pattern in a conductive polymeric layer comprising the steps of:
   (a) contacting a charge pattern with an electrographic developer composition comprising a carrier and marking particles having a polarity opposite that of said charge pattern thereby producing a developed image pattern, wherein said marking particles contain a conductivity modifier
   (b) applying the developed image pattern to a conductive layer containing an electrically conductive polymer and a polyanion on a substrate and
   (c) transferring said image pattern onto a said conductive layer.

2. The method of claim 1 further comprising a step d) wherein the image pattern is fixed by heating.

3. The method according to claim 1, wherein the carrier is liquid or dry.

4. A method of forming an image pattern using an electrophoretic migration imaging process comprising the steps of:
   (a) subjecting electrically photosensitive marking particles positioned between at least two electrodes to an applied electric field, wherein said electrically photosensitive marking particles contain a conductivity modifier, wherein the marking particles are suspended in a carrier;
   (b) exposing said marking particles to an image pattern of radiation to which the particles are photosensitive, thereby obtaining an image pattern on at least one of said electrodes; and
   (c) contacting the image pattern with a conductive polymeric layer.

5. The method of claim 4 wherein the carrier for the marking particles is a dielectric liquid.

6. The method of claim 1 or 4 wherein the conductivity modifier is conductivity degrading or conductivity enhancing.

7. The method of claim 1 or 4 wherein the conductivity modifier is:
   (a) represented by the following Formula II:

$$(OH)_n—R—(COX)_m \qquad \text{II}$$

wherein m and n are independently an integer of from 1 to 20, R is an alkylene group having 2 to 20 carbon atoms, an arylene group having 6 to 14 carbon atoms in the arylene chain, a pyran group, or a furan group, and X is —OH or —NYZ, wherein Y and Z are independently hydrogen or an alkyl group; or
   (b) a sugar, sugar derivative, polyalkylene glycol, or glycerol compound; or
   (c) selected from the group consisting of N-methylpyrrolidone, pyrrolidone, caprolactam, N-methyl caprolactam, or N-octylpyrrolidone.

8. The method of claim 1 or 4 wherein the conductivity enhancing modifier is N-methylpyrrolidone, pyrrolidone, caprolactam, N-methylcaprolactam, N-octylpyrrolidone, sucrose, glucose, fructose, lactose, sugar alcohol, 2-furan carboxylic acid, 3-furan carboxylic acid, sorbitol, glycol, ethylene glycol, glycerol, diethylene glycol, or triethylene glycol, or a mixture of two or more of these compounds.

9. The method of claim 6 wherein the conductivity enhancing modifier is N-methylpyrrolidone, pyrrolidone, caprolactam, N-methyl caprolactam, or N-octylpyrrolidone.

10. The method of claim 6 wherein the conductivity enhancing modifier is ethylene glycol, diethylene glycol or glycerol.

11. The method of claim 6 wherein the conductivity degrading modifier includes oxidants selected from the group consisting of $ClO^-$, $BrO^-$, $MnO_4^-$, $Cr_2O_7^{-2}$, $—S_2O_8^{-2}$, and $H_2O_2$.

12. The method of claim 7 wherein m and n independently of one another denote an integer from 2 to 8.

13. The method of claim 8 wherein the conductivity enhancing compound is sucrose, glucose, fructose, lactose, sorbitol, mannitol, 2-furancarboxylic acid, 3-furancarboxylic acid, ethylene glycol, glycerol, di-or triethylene glycol.

14. The method of claim 1 or 4 wherein the concentration of conductivity modifier in the marking particles is 0.01 to 30 wt. % based on the weight of the marking particles.

15. The method of claim 1 or 4 wherein the concentration of conductivity modifier in the marking particles is 0.5 to 10 wt. % based on the weight of the marking particles.

16. The method of claim 1 or 4 wherein the concentration of conductivity modifying agent in the marking particle is 0.5 to 5 wt. % based on the weight of the marking particle.

17. The method of claim 1 or 4 wherein the marking particles have a particle size of 0.05 micron to 20 microns.

18. The method of claim 1 or 4 wherein the marking particles have a particle size of 0.1 micron to 2.0 microns.

19. The method of claim 1 wherein the electrographic developer contains a conductivity modifier in a concentration of $10^{-6}$ g/liter to 100 g/liter.

20. The method of claim 4 wherein the suspension of marking particles contains a conductivity modifier in a concentration of $10^{-6}$ g/liter to 100 g/liter.

21. An element comprising a support on which is disposed an organic electroconductive polymeric layer containing a conductive polymer, such that when the electrographic developer composition of claim 1 or the marking particles of claim 4 contacts said electroconductive layer, the resistivity of the areas that are contacted decreases or increases by at least a factor of 10.

22. The element of claim 21 wherein the layer containing the conductive polymer contains 10 to 1000 mg/m² dry coating weight of the conductive polymer.

23. The element of claim 21 wherein the layer containing the conductive polymer contains 20 to 500 mg/m² dry coating weight of the conductive polymer.

24. The element of claim 21 wherein the conductive polymer is a substituted or unsubstituted pyrrole-containing polymer, a substituted or unsubstituted thiophene-containing polymer, or a substituted or unsubstituted aniline-containing polymer.

25. The element of claim 21 wherein the layer containing the conductive polymer comprises:

a) a mixture containing a polythiophene according to Formula I;

Polythiophene Formula (I)

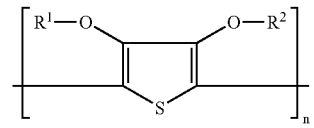

wherein each of $R^1$ and $R^2$ independently represents hydrogen or a $C_1$–$C_4$ alkyl group or together represent an optionally substituted C1–C4 alkylene group or a cycloalkylene group, preferably an ethylene group, an optionally alkyl-substituted methylene group, an optionally $C_1$–$C_{12}$ alkyl- or phenyl-substituted 1,2-ethylene group, a 1,3-propylene group or a 1,2-cyclohexylene group, and n is 5–1000;

b) a polyanion compound; and, optionally c) a film forming polymeric binder.

26. The element of claim 25 wherein the polyanion is an anion of a polymeric carboxylic acid.

27. The element of claim 25 wherein the polyanion is a polyacrylic acid, a poly(methacrylic acid), a poly(maleic acid), or a polymeric sulfonic acid.

28. The element of claim 25 wherein the polyanion is a polystyrenesulfonic acid or a polyvinylsulfonic acid.

29. The element of claim 25 wherein the film-forming polymeric binder comprises from 5 to 95 wt % of the layer containing the conductive polymer.

30. The element of claim 25 wherein the film-forming polymeric binder is gelatin or gelatin derivatives.

31. A method according to claim 1 or 4, wherein said marking particle also comprises a colorant.

32. A method according to claim 1 or 4, wherein said marking particle also comprises a resin.

* * * * *